United States Patent
Miyao et al.

(10) Patent No.: US 10,914,021 B2
(45) Date of Patent: Feb. 9, 2021

(54) POLYCRYSTALLINE SILICON ROD AND METHOD FOR PRODUCING SINGLE CRYSTAL SILICON

(71) Applicant: Shin-Etsu Chemical Co., Ltd., Tokyo (JP)

(72) Inventors: Shuichi Miyao, Niigata (JP); Masahiko Ishida, Niigata (JP); Naruhiro Hoshino, Niigata (JP); Shigeyoshi Netsu, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 103 days.

(21) Appl. No.: 16/161,526

(22) Filed: Oct. 16, 2018

(65) Prior Publication Data
US 2019/0119829 A1 Apr. 25, 2019

(30) Foreign Application Priority Data

Oct. 20, 2017 (JP) ................. 2017-203017

(51) Int. Cl.
*C30B 15/00* (2006.01)
*C30B 29/06* (2006.01)
(Continued)

(52) U.S. Cl.
CPC ............ *C30B 29/06* (2013.01); *C01B 33/035* (2013.01); *C01B 33/037* (2013.01); *C30B 13/34* (2013.01);
(Continued)

(58) Field of Classification Search
CPC ......... C30B 15/00; C30B 13/00; C30B 28/12; C30B 28/14
See application file for complete search history.

(56) References Cited

U.S. PATENT DOCUMENTS

2008/0286550 A1   11/2008  Sofin et al.
2014/0004377 A1*   1/2014  Kaito ................. C30B 29/62
                                                    428/636
(Continued)

FOREIGN PATENT DOCUMENTS

CN        102557038      *  7/2012
JP        H11049508 A       2/1999
(Continued)

OTHER PUBLICATIONS

Office Action dated Oct. 20, 2020, issued in counterpart Japanese Application No. 2017-203017 (w/ English translation, 12 pages).

*Primary Examiner* — Robert M Kunemund
(74) *Attorney, Agent, or Firm* — Westerman, Hattori, Daniels & Adrian, LLP

(57) ABSTRACT

The present invention provides polycrystalline silicon suitably used as a raw material for producing single crystal silicon. The polycrystalline silicon rod of the present invention is a polycrystalline silicon rod grown by chemical vapor deposition performed under a pressure of 0.3 MPaG or more, wherein when a plate-shaped sample piece collected from an arbitrary portion of the polycrystalline silicon rod is observed with a microscope with a temperature increased from a temperature lower than a melting point of silicon up to a temperature exceeding the melting point of silicon, a heterogeneous crystal region, which is a crystal region including a plurality of crystal grains heterogeneously assembled and including no needle-like crystal, having a diameter exceeding 10 μm is not observed.

2 Claims, 4 Drawing Sheets

(51) Int. Cl.
    *C01B 33/035*      (2006.01)
    *C01B 33/037*      (2006.01)
    *C30B 13/34*      (2006.01)
    *C30B 15/36*      (2006.01)
    *C30B 25/00*      (2006.01)
    *C30B 29/60*      (2006.01)
    *C30B 35/00*      (2006.01)

(52) U.S. Cl.
    CPC .............. *C30B 15/36* (2013.01); *C30B 25/00* (2013.01); *C30B 29/605* (2013.01); *C30B 35/007* (2013.01)

(56) References Cited

U.S. PATENT DOCUMENTS

| | | |
|---|---|---|
| 2016/0187268 A1 | 6/2016 | Miyao et al. |
| 2017/0210630 A1* | 7/2017 | Miyao .................. C01B 33/035 |
| 2018/0002180 A1 | 1/2018 | Miyao et al. |

FOREIGN PATENT DOCUMENTS

| | | |
|---|---|---|
| JP | 2008-285403 A | 11/2008 |
| JP | 2014-31297 A | 2/2014 |
| JP | 2014114184 A | 6/2014 |
| JP | 2015-9996 A | 1/2015 |
| JP | 2016041636 A | 3/2016 |
| JP | 2016150885 A | 8/2016 |

\* cited by examiner

120mm

EXAMPLE 1
COMPARATIVE
EXAMPLE 1
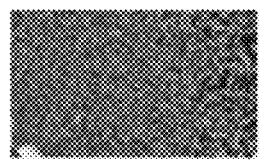
COMPARATIVE
EXAMPLE 2
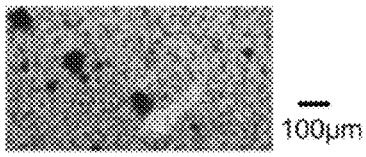
EXAMPLE 3
EXAMPLE 5
COMPARATIVE
EXAMPLE 3
COMPARATIVE
EXAMPLE 4

POLYCRYSTALLINE SILICON ROD AND METHOD FOR PRODUCING SINGLE CRYSTAL SILICON

BACKGROUND OF THE INVENTION

Field of the Invention

The present invention relates to polycrystalline silicon suitably used as a production raw material of single crystal silicon, and more specifically, it relates to polycrystalline silicon that minimally causes a local unmelted residue when used as a raw material in growing single crystal silicon by a CZ method or an FZ method.

Description of the Related Art

Single crystal silicon indispensable for production of semiconductor devices and the like is grown by a CZ method or an FZ method, and polycrystalline silicon is used as a raw material in the crystal growth. Such polycrystalline silicon is produced by Siemens process in many cases. In the Siemens process, a silane material gas such as trichlorosilane or monosilane is brought into contact with a heated silicon core wire to vapor grow (deposit) polycrystalline silicon on the surface of the silicon core wire by CVD (Chemical Vapor Deposition).

When single crystal silicon is grown by, for example, the CZ method, a quartz crucible is charged with a polycrystalline silicon mass to obtain a silicon melt by heating and melting the silicon mass, seed crystal is immersed in the silicon melt to eliminate a dislocation line, and after thus making the silicon dislocation-free, crystal-pulling is performed with the diameter gradually increased to a desired diameter. Here, when unmelted polycrystalline silicon remains in the silicon melt, such an unmelted polycrystalline piece is drifted about in the vicinity of a solid-liquid interface by convection, and may induce dislocation generation to eliminate a crystal line.

Besides, during a step of producing a polycrystalline silicon rod by the Siemens process, needle-like crystals may be deposited in the rod in some cases. When such a polycrystalline silicon rod is used for growing single crystal silicon by the FZ method, individual crystallites are not homogeneously melted in accordance with their sizes due to the above-described heterogeneous microstructure, and unmelted crystallites pass through a melting zone in the form solid particles to the single crystal rod, and are incorporated into a solidified surface of the single crystal in the form of unmelted particles. It is known that a defect is thus formed.

For solving this problem, Japanese Patent Laid Open No. 2008-235403 has proposed the following method. A surface of a sample cut vertically to the longitudinal direction of a polycrystalline silicon rod is ground or polished to increase contrast to a level sufficient to visually recognize microcrystal of an etched tissue even with an optical microscope, and the size and the area ratio of needle-like crystals are measured. On the basis of results of the measurement, it is determined whether or not the silicon rod is suitable as a raw material for growing FZ single crystal silicon.

In the suitability determination based on the visual observation with an optical microscope as in the method disclosed in Japanese Patent Laid-Open No. 2008-285403, however, the results are easily varied depending on the degree of etching the surface of the sample to be observed and observation skill of a person in charge of evaluation, and in addition, quantitativity and reproducibility are poor. Therefore, from the viewpoint of increasing the production yield of single crystal silicon, it is necessary to set high criterion for the suitability determination, and as a result, a defective rate of polycrystalline silicon rods is unavoidably high.

In consideration of this problem, Japanese Patent Laid-Open No. 2014-31297 has proposed the following as a method for selecting, with high quantitativity and reproducibility, polycrystalline silicon suitably used as a raw material for producing single crystal silicon: An electron backscatter diffraction image (EBSD image) obtained by irradiating, with an electron beam, a main surface of a plate-shaped sample collected from a polycrystalline silicon rod is analyzed to select a polycrystalline silicon rod simultaneously satisfying the following two conditions as a raw material for producing single crystal silicon:

Condition 1: A total area of regions where a crystal grain having a grain size of 0.5 urn or more is not detected is 10% or less of the whole area irradiated with the electron beam.

Condition 2: The number of crystal grains having a grain size of 0.5 μm or more and less than 3 μm is 45% or more of ail the detected crystal grains.

By the EBSD method, however, the grain size along each direction of every crystal grain can be evaluated, but a crystal region where a plurality of crystal grains are heterogeneously assembled like needle-like crystals (a heterogeneous crystal region) itself cannot be evaluated.

Japanese Patent Laid-open No. 2015-9996 also has proposed a method foe selecting, with high quantitativity and reproducibility, polycrystalline silicon suitably used as a raw material for producing single crystal silicon. Specifically, Japanese Patent Laid-Open No. 2015-9996 has proposed a method for evaluating a crystal grain distribution of polycrystalline silicon by X-ray diffraction as follows: Polycrystalline silicon is formed into a plate-shaped sample, the plate-shaped sample is disposed in a position where Bragg reflection from a Miller index surface <hfl> is detected, and the plate-shaped sample is in-plane rotated at a rotation angle ϕ with the center thereof set as the rotation center, so as to scan a main surface of the plate-shaped sample with an X-ray irradiation region defined by a slit. Thus, a ϕ scan chart corresponding to dependence, on the rotation angle ϕ of the plate-shaped sample, of intensity of the Bragg reflection from the Miller index surface is obtained. Besides, the amount of change per unit rotation angle of diffraction intensity of a baseline of the ϕ scan chart is obtained as a primary differential value, and skewness obtained through normal distribution of the absolute value of the amount of change is calculated. The thus obtained skewness (b value) is used as an evaluation index of the crystal grain distribution.

This method is, however, based on information of a diffraction line on the basis of Miller indices obtained from individual crystal grains, and therefore, a crystal region where a plurality of crystal grains are heterogeneously assembled like needle-like crystals (a heterogeneous crystal region) itself cannot be evaluated.

On the contrary to these evaluation methods, when polycrystalline silicon is etched with a mixture of hydrofluoric acid and nitric acid and the etched surface is observed with a microscope, not only individual crystal grains but also a crystal region where a plurality of crystal grains are heterogeneously assembled (a heterogeneous crystal region) can be clearly observed.

According to the result of examination made by the present inventors, however, it has been confirmed that even when single crystal silicon is grown by the FZ method by using, as a raw material, polycrystalline silicon where a heterogeneous crystal region has been found by the etching method, dislocation generation is not always caused.

SUMMARY OF THE INVENTION

No matter whether CZ single crystal silicon or FZ single crystal silicon is to be produced, as the diameter is larger, a heterogeneous crystal region present in polycrystalline silicon used as a raw material more remarkably affects the production yield (the single crystallization rate).

The present invention was devised in consideration of these circumstances, and an object of the present invention is to provide polycrystalline silicon in which a local unmelted residue is minimally caused when used as a raw material for growing single crystal silicon by a CZ method or an FZ method, and to provide a technique for improving the production yield of single crystal silicon having a large diameter.

A polycrystalline silicon rod according to a first aspect of the present invention is a polycrystalline silicon rod grown by chemical vapor deposition performed under a pressure of 0.3 MPaG or more, wherein when a plate-shaped sample piece collected from an arbitrary portion of the polycrystalline silicon rod is observed with a microscope with a temperature increased from a temperature lower than a melting point of silicon up to a temperature exceeding the melting point of silicon, a heterogeneous crystal region, which is a crystal region including a plurality of crystal grains heterogeneously assembled and including no needle-like crystal, having a diameter exceeding 10 μm is not observed.

A polycrystalline silicon rod according to a second aspect of the present invention is a polycrystalline silicon rod grown by chemical vapor deposition performed under a pressure of 0.1 MPaG or less, wherein when a plate-shaped sample piece collected from an arbitrary portion of the polycrystalline silicon rod is observed with a microscope with a temperature increased from a temperature lower than a melting point of silicon up to a temperature exceeding the melting point of silicon, a heterogeneous crystal region, which is a crystal region including a plurality of crystal grains heterogeneously assembled and including no needle-like crystal, having a diameter exceeding 100 μm is not observed.

In a method for producing single crystal silicon according to the present invention, the above-described polycrystalline silicon rod is used as a raw material.

In a process of single crystallization performed by an FZ method using a polycrystalline silicon rod of the present invention as a raw material, or in a process of single crystallization performed by a CZ method using a polycrystalline silicon mass obtained from a polycrystalline silicon rod of the present invention, a local unmelted residue is minimally caused, and hence, the present invention contributes to stable production of single crystal silicon.

BRIEF DESCRIPTION OF THE DRAWINGS

FIGS. 4A, 4B, 4C, 4D, 4E, 4F and 4G are exemplified optical microscope images of plate-shaped samples in a state where the samples are at a temperature just below the melting point (immediately before melting).

DETAILED DESCRIPTION OF THE PREFERRED EMBODIMENT

The present inventors directly observed, with a microscope, a molten state of polycrystalline silicon during production of single crystal silicon, resulting in finding that there is a relation between a size of a crystal region where a plurality of crystal grains are heterogeneously assembled at a temperature just below a melting point (immediately before melting) and a yield obtained when the silicon is used as a raw material for single crystallization (a single crystallization rate).

Specifically, in using a polycrystalline silicon rod grown by chemical vapor deposition under a pressure of 0.3 MPaG or more, a plate-shaped sample collected from an arbitrary portion of the polycrystalline silicon rod is observed with a microscope with a temperature increased from a temperature lower than the melting point of silicon up to a temperature exceeding the melting point of silicon. In this case, when a heterogeneous crystal region, which is a crystal region including a plurality of crystal grains heterogeneously assembled and including no needle-like crystal, having a diameter exceeding 10 μm is not observed at a temperature just below the melting point, high yield (a high single crystallization rate) can be obtained by using this polycrystalline silicon rod as a raw material for the single crystallization.

Alternatively, in using a polycrystalline silicon rod grown by the chemical vapor deposition under a pressure of 0.1 MPaG or less, a plate-shaped sample collected from an arbitrary portion of the polycrystalline silicon rod is observed with a microscope with a temperature increased from a temperature lower than the melting point of silicon up to a temperature exceeding the melting point of silicon. In this case, when a heterogeneous crystal region, which is a crystal region including a plurality of crystal grains heterogeneously assembled and including no needle-like crystal, having a diameter exceeding 100 μm is not observed at a temperature just below the melting point, high yield (a high single crystallization rate) can be obtained by using this polycrystalline silicon rod as a raw material for the single crystallization.

Incidentally, in either case, the present inventors have found that the single crystallization rate is minimally affected even if needle-like crystals are included as long as the crystal region where a plurality of crystal grains are heterogeneously assembled has a size satisfying the above-described condition.

Figure 1A:
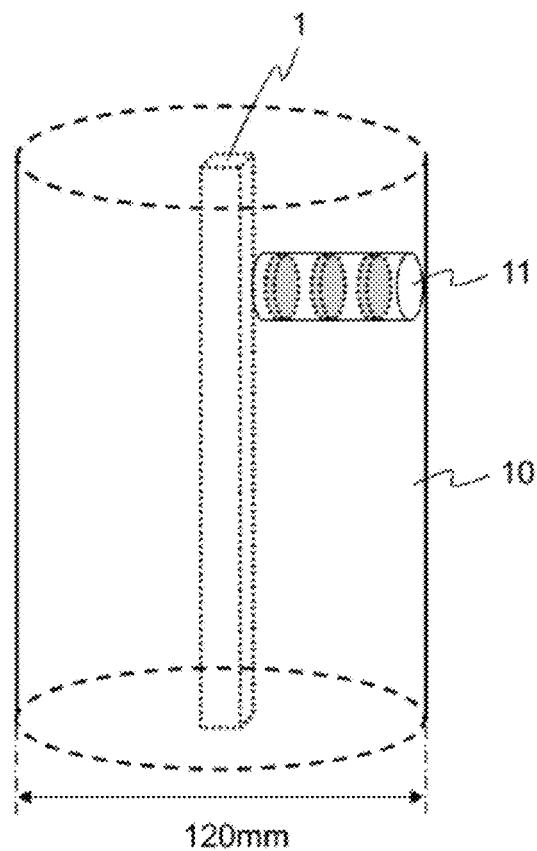
FIGS. 1A and 1B are diagrams used for explaining collection, from a polycrystalline silicon rod grown through deposition by chemical vapor deposition, of a plate-shaped sample having a surface parallel to a vertical direction as a main surface.
Figure 1B:
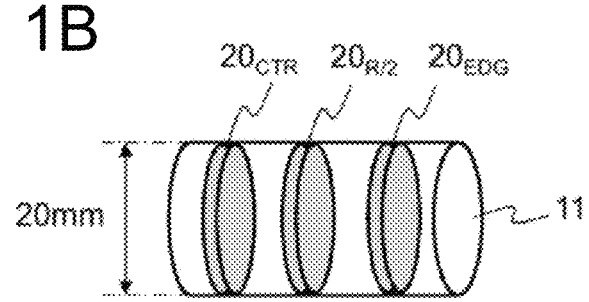
Figure 2A:
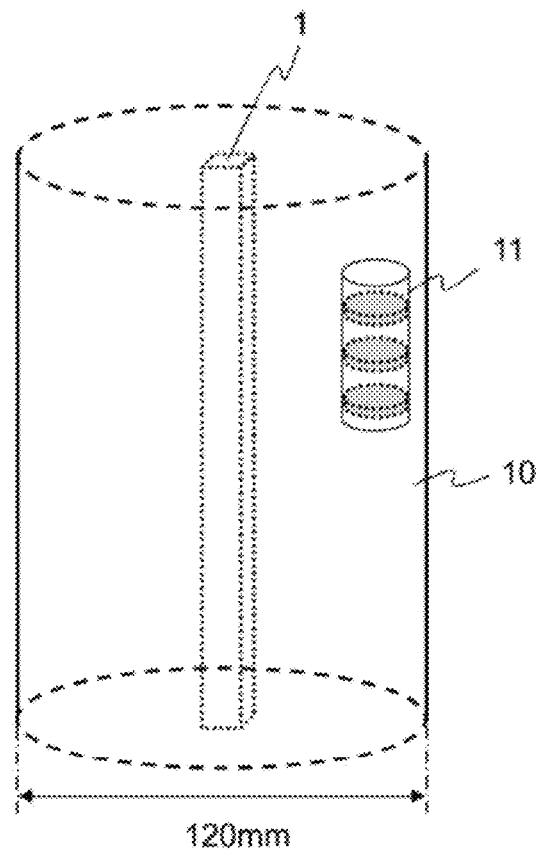
FIGS. 2A and 2B are diagrams used for explaining collection, from a polycrystalline silicon rod grown through deposition by the chemical vapor deposition, of a plate-shaped sample having a surface vertical to the vertical direction as a main surface.
Figure 2B:
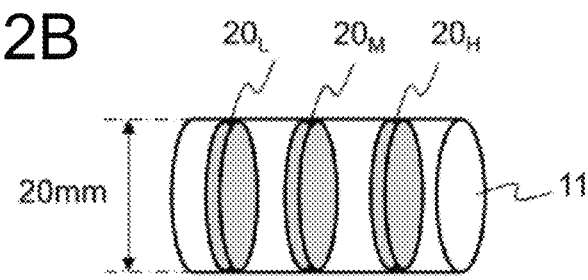

The plate-shaped sample is collected, for example, as illustrated in FIGS. 1A and 1B (illustrating a case of collecting a plate-shaped sample having a surface vertical to a vertical direction as a main surface), or in FIGS. 2A and 2B (illustrating a case of collecting a plate-shaped sample having a surface parallel to the vertical direction as a main surface).

Referring to FIGS. 1A and 1B, a reference sign 1 denotes a silicon core wire used for obtaining a silicon rod by depositing polycrystalline silicon thereon. Incidentally, in this exemplified case, plate-shaped samples 20 are collected respectively from three portions (CTR: a portion close to the silicon core wire 1, EDG: a portion close to an outer side surface of the polycrystalline silicon rod 10, and R/2: a portion disposed in the middle between the portions CTR and EDG).

The polycrystalline silicon rod 10 exemplarily illustrated in FIG. 1A has a diameter of 200 mm or more, and a rod 11 having a diameter of about 20 mm and a length of about 70 mm or more is hollowed out from all surfaces including the outer side surface of the polycrystalline silicon rod 10.

Then, as illustrated in FIG. 1B, plate-shaped samples ($20_{CRT}$, $20_{EDG}$ and $20_{R/2}$) each having a thickness of about 2 mm are collected respectively from a portion (CTR) close to the silicon core wire 1 of the rod 11, a portion (EDG) close to a side surface of the polycrystalline silicon rod 10, and a portion (R/2) disposed in the middle between the portions CTR and EDG.

A plate-shaped sample piece (a sample piece) for optical microscope observation is cut out from each of the thus collected plate-shaped samples 20. The sample piece has a thickness of, for example, 1 mm, and the surface thereof is adjusted by lapping (with a #360 abrasive), followed by miller finish with a 3 μm diamond abrasive.

Figure 3:
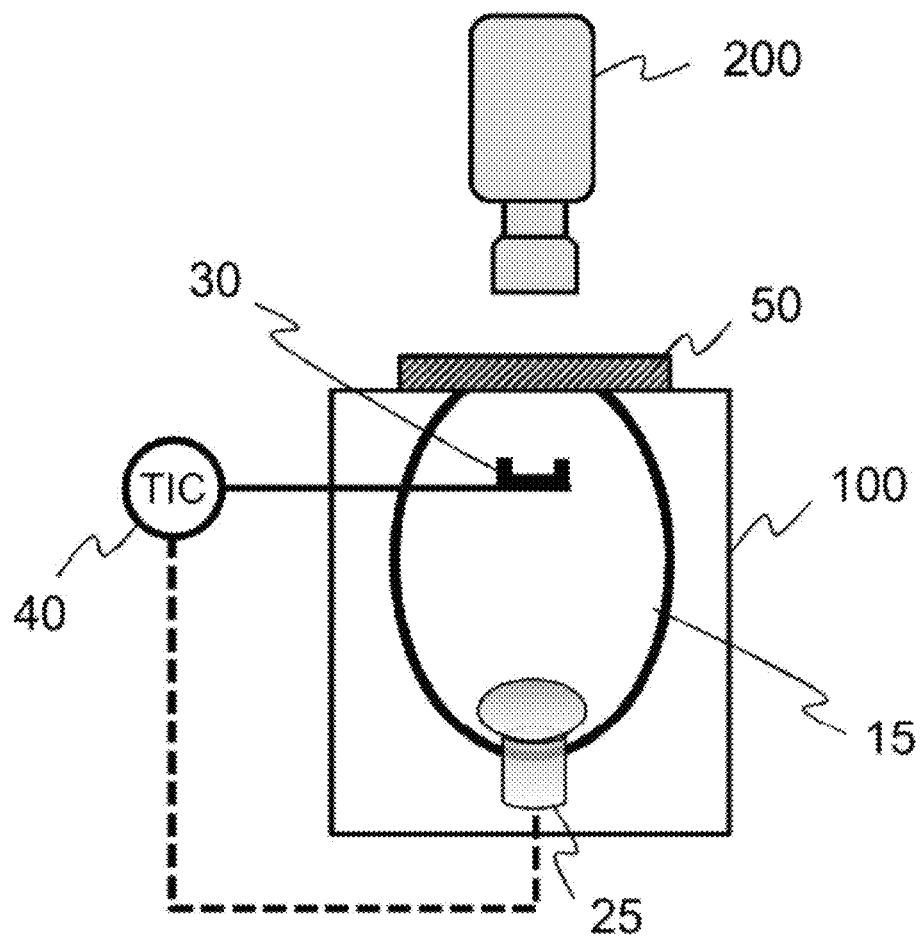
FIG. 3 is a block diagram illustrating the outline of an observation system of an optical microscope image for observing a state where a plate-shaped sample is heated and is at a temperature just below a melting point (immediately before melting)

FIG. 3 is a block diagram illustrating the outline of an observation system of an optical microscope image for observing a state where the plate-shaped sample piece is heated and is at a temperature just below the melting point (immediately before melting).

A high temperature observation furnace 100 is a furnace of a light-condensing heating method including a reflection barrel 15 and a halogen lamp 25. In an example illustrated in this drawing, model MS-17SP manufactured by Yonekura Mfg. Co., Ltd. (a stainless steel reflection barrel having a gold-deposited inner surface) is used as the reflection barrel 15. Into the reflection barrel 15, a sample vessel 30 (of, for example, an alumina dish having an inner diameter of 5 mm) holding the plate-shaped sample piece therein is inserted. A sensor of a thermocouple thermometer 40 is disposed on a bottom of the sample vessel 30, and a current to be supplied to the halogen lamp 25 is TIC controlled. The sample is in a shape of, for example, a rectangle having a side of 2.0 mm and having a thickness of 1.0 mm.

With an Ar gas supplied into the reflection barrel 15 at a flow rate of 100 ml/min, the sample piece is heated with the halogen lamp 25. Incidentally, a temperature increase rate is, for example, 60° C./min up to 200° C., 200° C./min in a temperature range of 200 to 1100° C., and 50° C./min in a temperature range of 1100 to 1550° C.

A quartz glass window 50 is provided in an upper portion of the reflection barrel 15, and the sample can be observed with an optical microscope 200 through this window 50. As the optical microscope 200, for example, model RH2000 manufactured by HIROX Co., Ltd. is used. An observation magnification is, for example, 120 times, and a state where the sample piece is immediately before melting is video recorded, so that a desired frame can be analyzed as a still image.

Examples

A polycrystalline silicon rod was grown by Siemens process using TCS as a raw material with plural pairs of silicon core wires disposed in a reaction furnace. The growth was performed under a pressure of 0.3 MPaG or more (the pressured condition) and under a pressure of 0.1 MPaG or less (the normal pressure condition).

Among the thus grown ten polycrystalline silicon rods, those in which a crystal line did not eliminate in growing single crystal silicon by the FZ method were used as Examples 1 to 6, and those in which a crystal line eliminated were used as Comparative Examples 1 to 4. Conditions for growing the polycrystalline silicon are shown in Tables 1 and 2. It is noted that a surface temperature was calculated by adding, to a temperature value indicated by a radiation thermometer, a temperature decrement due to infrared absorption by a CVD reaction gas (corresponding to optical path fault).

Besides, among the ten samples, optical micrographs of the samples of Examples 1, 3, 5 and Comparative Examples 1 to 4 obtained at a temperature just below the melting point (immediately before melting) are illustrated in FIGS. 4A to 4G.

TABLE 1

| Pressured Condition | Pressure (MPaG) | Surface Temperature (° C.) | TCS CONCENTRATION (vol %) | Needle-like Crystals |
|---|---|---|---|---|
| Example 1 | 0.45 | 1000-1100 | 35 | not included |
| Example 2 | 0.30 | 1000-1100 | 35 | not included |
| Example 3 | 0.45 | 1000-1150 | 25-35 | included |
| Example 4 | 0.30 | 1000-1150 | 25-35 | included |
| Comparative Example 1 | 0.45 | 1050-1100 | 35 | not included |
| Comparative Example 2 | 0.20 | 1000-1100 | 35 | not included |

TABLE 2

| Normal Pressure Condition | Pressure (MPaG) | Surface Temperature (° C.) | TCS CONCENTRATION (vol %) | Needle-like Crystals |
|---|---|---|---|---|
| Example 5 | 0.05 | 1050-1150 | 20 | not included |
| Example 6 | 0.10 | 1050-1150 | 20 | not included |
| Comparative Example 3 | 0.05 | 1100-1150 | 20 | not included |
| Comparative Example 4 | 0.05 | 1150-1150 | 20 | not included |

First, the samples obtained under the pressured condition are summarized as follows: In any of the samples of Examples 1 to 4, as a result of the optical microscope observation performed under the above-described conditions, a heterogeneous crystal region, which is a crystal region including a plurality of crystal grains heterogeneously assembled and including no needle-like crystal, having a diameter exceeding 10 μm was not observed at a temperature just below the melting point. On the contrary, in all the samples of Comparative Examples 1 and 2, a heterogeneous crystal region including no needle-like crystal and having a diameter exceeding 10 μm was observed at a temperature just below the melting point.

In other words, in using a polycrystalline silicon rod grown by the chemical vapor deposition under a pressure of 0.3 MPaG or more, regardless of the presence of needle-like crystals, in the case where a plate-shaped sample piece collected from an arbitrary portion of the polycrystalline silicon rod is observed with a microscope with a temperature increased from a temperature lower than the melting point of silicon up to a temperature exceeding the melting point of silicon, and a heterogeneous crystal region, which is a crystal region including a plurality of crystal grains heterogeneously assembled and including no needle-like crystal, having a diameter exceeding 10 µm is not observed at a temperature just below the melting point, when this polycrystalline silicon rod is used as a raw material for growing single crystal silicon by the FZ method, there is a tendency that a crystal line does not eliminate.

Next, the samples obtained under the normal pressure condition are summarized as follows: In any of the samples of Examples 5 to 6, as a result of the optical microscope observation performed under the above-described conditions, a heterogeneous crystal region, which is a crystal region including a plurality of crystal grains heterogeneously assembled and including no needle-like crystal, having a diameter exceeding 100 µm was not observed at a temperature just below the melting point. On the contrary, in all the samples of Comparative Examples 3 to 4, a heterogeneous crystal region, where a crystal region not including a needle-like crystal has a diameter exceeding 100 µm, was observed at a temperature just below the melting point.

In other words, in using a polycrystalline silicon rod grown by the chemical vapor deposition under a pressure of 0.1 MPaG or more, regardless of the presence of needle-like crystals, in the case where a plate-shaped sample piece collected from an arbitrary portion of the polycrystalline silicon rod is observed with a microscope with a temperature increased from a temperature lower than the melting point of silicon up to a temperature exceeding the melting point of silicon, and a heterogeneous crystal region, which is a crystal region including a plurality of crystal grains heterogeneously assembled and including no needle-like crystal, having a diameter exceeding 100 µm is not observed at a temperature just below the melting point, when this polycrystalline silicon rod is used as a raw material for growing single crystal silicon by the FZ method, there is a tendency that a crystal line does not eliminate.

Incidentally, the above-described examination results indicate that, regardless of the presence of needle-like crystals, a polycrystalline silicon rod can be evaluated as suitable or not depending on whether or not a heterogeneous crystal region including no needle-like crystal and having a diameter exceeding 10 µm or 100 µm is observed. One reason why such evaluation can be made can be an effect of a size of a needle-like crystal observed in each of the above-described samples. Although needle-like crystals were found in the sample of Example 3, the size in terms of a cross-sectional diameter was 10 µm or more, and one having a size less than 10 urn was not detected. Needle-like crystals were also found in the sample of Example 4, the size thereof in terms of a cross-sectional diameter was 10 urn or less but the size in terms of a longitudinal length was all 10 urn or more.

In other words, it is presumed that a needle-like crystal having a cross-sectional diameter of 10 µm or more, or a needle-like crystal having a cross-sectional diameter of 10 µm or less and a longitudinal length of 10 µm or more is difficult to cause the elimination of a crystal line in growing single crystal silicon by the FZ method.

The present invention thus provides polycrystalline silicon suitably used as a raw material for producing single crystal silicon.

What is claimed is:

1. A method of manufacturing a single crystal silicon, comprising:
    growing a polycrystalline silicon rod by chemical vapor deposition performed under a pressure of 0.3 MPaG or more;
    selecting a polycrystalline silicon rod that satisfies a condition that when a sample piece collected from an arbitrary portion of the polycrystalline silicon rod is observed with a microscope under a condition where the sample piece is heated so that a temperature of the sample piece increases from a temperature lower than a melting point of silicon to 1550° C., a crystal which is not needle-like and having a diameter exceeding 10 µm is not observed in a heterogeneous crystal region, which is a crystal region including a plurality of crystal grains heterogeneously assembled,
    wherein the sample piece is a rectangular plate having a thickness of 1 mm, a length of 2 mm, and a width of 2 mm; and
    growing the single crystal silicon by using the selected polycrystalline silicon rod.

2. A method of manufacturing a single crystal silicon, comprising:
    growing a polycrystalline silicon rod by chemical vapor deposition performed under a pressure of 0.1 MPaG or less;
    selecting a polycrystalline silicon rod that satisfies a condition that when a sample piece collected from an arbitrary portion of the polycrystalline silicon rod is observed with a microscope under a condition where the sample piece is heated so that a temperature of the sample piece increases from a temperature lower than a melting point of silicon to 1550° C., a crystal which is not needle-like and having a diameter exceeding 100 µm is not observed in a heterogeneous crystal region, which is a crystal region including a plurality of crystal grains heterogeneously assembled,
    wherein the sample piece is a rectangular plate having a thickness of 1 mm, a length of 2 mm, and a width of 2 mm; and
    growing the single crystal silicon by using the selected polycrystalline silicon rod.

* * * * *